(12) United States Patent
Mei

(10) Patent No.: US 12,185,526 B2
(45) Date of Patent: Dec. 31, 2024

(54) METHOD FOR MANUFACTURING SEMICONDUCTOR STRUCTURE, SEMICONDUCTOR STRUCTURE AND SEMICONDUCTOR MEMORY

(71) Applicant: CHANGXIN MEMORY TECHNOLOGIES, INC., Hefei (CN)

(72) Inventor: Xiaobo Mei, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 494 days.

(21) Appl. No.: 17/542,876

(22) Filed: Dec. 6, 2021

(65) Prior Publication Data

US 2023/0032102 A1 Feb. 2, 2023

Related U.S. Application Data

(63) Continuation of application No. PCT/CN2021/113606, filed on Aug. 19, 2021.

(30) Foreign Application Priority Data

Aug. 2, 2021 (CN) .......................... 202110880780.3

(51) Int. Cl.
    H10B 12/00 (2023.01)
(52) U.S. Cl.
    CPC ........... *H10B 12/34* (2023.02); *H10B 12/053* (2023.02)
(58) Field of Classification Search
    None
    See application file for complete search history.

(56) References Cited

U.S. PATENT DOCUMENTS

| | | |
|---|---|---|
| 7,148,120 B2 | 12/2006 | Chen |
| 10,074,656 B1 | 9/2018 | Wang |
| 10,411,014 B2 | 9/2019 | Hwang |
| 2015/0126013 A1 | 5/2015 | Hwang et al. |
| 2016/0329337 A1 | 11/2016 | Hwang et al. |
| 2018/0261603 A1 | 9/2018 | Wang et al. |
| 2018/0350817 A1 | 12/2018 | Wang et al. |
| 2019/0348418 A1 | 11/2019 | Hwang et al. |
| 2020/0161306 A1* | 5/2020 | Seo ........................ H10B 12/34 |
| 2020/0203351 A1* | 6/2020 | Chae .................... H10B 12/488 |

FOREIGN PATENT DOCUMENTS

| | | |
|---|---|---|
| CN | 107946232 A | 4/2018 |
| CN | 108573926 A | 9/2018 |
| CN | 110911345 A | 3/2020 |
| CN | 112447602 A | 3/2021 |

* cited by examiner

*Primary Examiner* — Hsien Ming Lee
(74) *Attorney, Agent, or Firm* — Syncoda LLC; Feng Ma

(57) ABSTRACT

A method for manufacturing the semiconductor structure includes: a substrate is provided; isolation structures having a first depth are formed in the substrate; word line structures having a second depth are formed in the substrate, where part of the word line structures are formed in respective ones of the isolation structures, and the second depth is less than the first depth; the isolation structures are etched in a direction perpendicular to the substrate to form a first trench having a third depth in each isolation structure; and a first insulating layer covering the word line structures and the first trenches is formed on the substrate to form an air gap structure in each isolation structure.

18 Claims, 18 Drawing Sheets

METHOD FOR MANUFACTURING SEMICONDUCTOR STRUCTURE, SEMICONDUCTOR STRUCTURE AND SEMICONDUCTOR MEMORY

CROSS-REFERENCE TO RELATED APPLICATIONS

This application is a continuation of International Application No. PCT/CN2021/113606, filed on Aug. 19, 2021, which claims priority to Chinese Patent Application No. 202110880780.3, filed on Aug. 2, 2021. The disclosures of International Application No. PCT/CN2021/113606 and Chinese Patent Application No. 202110880780.3 are hereby incorporated by reference in their entireties.

TECHNICAL FIELD

The embodiments of the disclosure relate, but are not limited, to a method for manufacturing a semiconductor structure, the semiconductor structure and a semiconductor memory.

BACKGROUND

When semiconductor devices such as a Dynamic Random Access Memory (DRAM) are formed, it is necessary to ensure the electrical isolation between internal components of the semiconductor devices. Herein, Shallow Trench Isolation (STI) is a common electrical isolation technology, especially suitable for a very-large-scale integration device. An STI structure is conducive to achieve a higher level of circuit integration. However, as the characteristic size of a semiconductor continues to evolve in a smaller direction, the capacitive coupling effect between word lines is becoming more and more obvious.

SUMMARY

In a first aspect, the embodiments of the disclosure provide a method for manufacturing a semiconductor structure, which may include the following operations. A substrate is provided, and isolation structures having a first depth are formed in the substrate. Word line structures having a second depth are formed in the substrate, where part of the word line structures are formed in respective ones of the isolation structures, and the second depth is less than the first depth. The isolation structures are etched in a direction perpendicular to the substrate to form a first trench having a third depth in each isolation structure. A first insulating layer covering the word line structures and the first trenches is formed on the substrate to form an air gap structure in each isolation structure.

In a second aspect, the embodiments of the disclosure provide a semiconductor structure, which may include a substrate, isolation structures, word line structures, first trenches and a first insulating layer. The isolation structures are formed in the substrate and have a first depth. The word line structures are formed in the substrate and have a second depth, where part of the word line structures are formed in respective ones of the isolation structures, and the second depth is less than the first depth. The first trenches are formed in respective isolation structures in a direction perpendicular to the substrate and have a third depth. The first insulating layer is formed on the substrate and covers the word line structures and the first trenches to form an air gap structure in each isolation structure.

DETAILED DESCRIPTION

Figure 1:
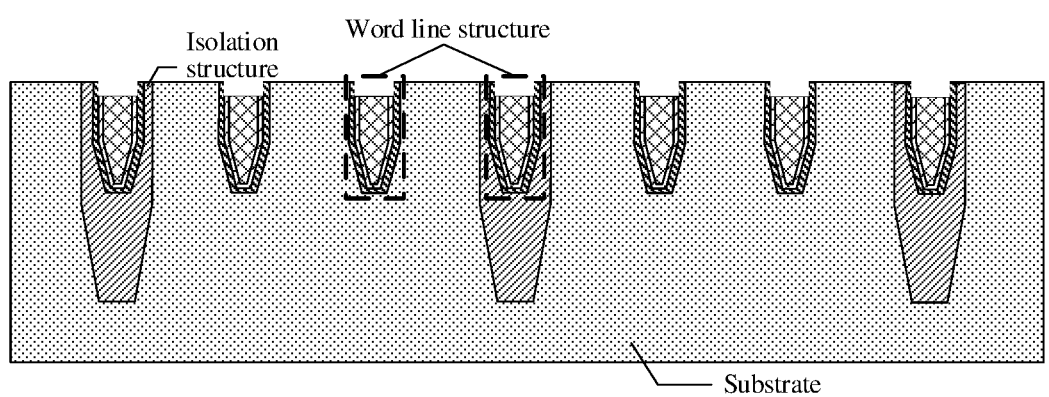
FIG. 1 is a schematic diagram of a section of a traditional semiconductor structure provided in an embodiment of the disclosure.

The technical solutions in the embodiments of the disclosure will be clearly and completely described below in combination with the drawings in the embodiments of the disclosure. It can be understood that, the specific embodiments described herein are only used to explain the relevant application, not to limit the disclosure. In addition, it is to be noted that, for ease of description, only parts related to the relevant application are shown in the drawings.

Unless otherwise defined, all technical and scientific terms used herein have the same meanings as commonly understood by those skilled in the art that the disclosure belongs to. Herein, terms used in the disclosure are only for the purpose of describing embodiments of the disclosure and not intended to limit the disclosure.

In the following description, reference is made to "some embodiments", which describe a subset of all possible embodiments, but it is understood that "some embodiments" may be the same or different subsets of all possible embodiments and may be combined with each other without conflict.

It should be noted that, the term "first\second\third" in the embodiments of the disclosure is only to distinguish similar objects and does not represent a specific order for objects. It is understandable that "first\second\third" can exchange a specific order or order if allowed, so that the embodiments of the disclosure described herein can be implemented in an order other than those illustrated or described herein.

Referring to FIG. 1, it illustrates a schematic diagram of a section of a traditional semiconductor structure provided in an embodiment of the disclosure. As shown in FIG. 1, the traditional semiconductor structure may include a substrate, isolation structures and word line structures. The isolation structure may be an STI structure. Moore's law exists in the field of semiconductors. Its core content is that: the number of transistors that may be accommodated on an integrated circuit will double every 18 months approximately. With the development of Moore's law, the characteristic size of a semiconductor is shrinking. However, with the continuous reduction of the characteristic size of the semiconductor, the capacitive coupling effect between word lines is becoming more and more obvious.

Based on this, the embodiments of the disclosure provide a method for manufacturing a semiconductor structure. The basic idea of the method is: a substrate is provided; isolation structures having a first depth are formed in the substrate; word line structures having a second depth are formed in the substrate, where part of the word line structures are formed in respective ones of the isolation structures, and the second depth is less than the first depth; the isolation structures are etched in a direction perpendicular to the substrate to form a first trench having a third depth in each isolation structure; and a first insulating layer covering the word line structures and the first trenches is formed on the substrate to form an air gap structure in each isolation structure. In this way, by forming the air gap structure in each isolation structure, the insulation performance of the semiconductor structure is effectively improved, which not only reduces the capacitive coupling effect between word lines, but also reduces the influence caused by tip leakage.

The various embodiments of the disclosure will be described in detail below in combination with the drawings.

Figure 2:
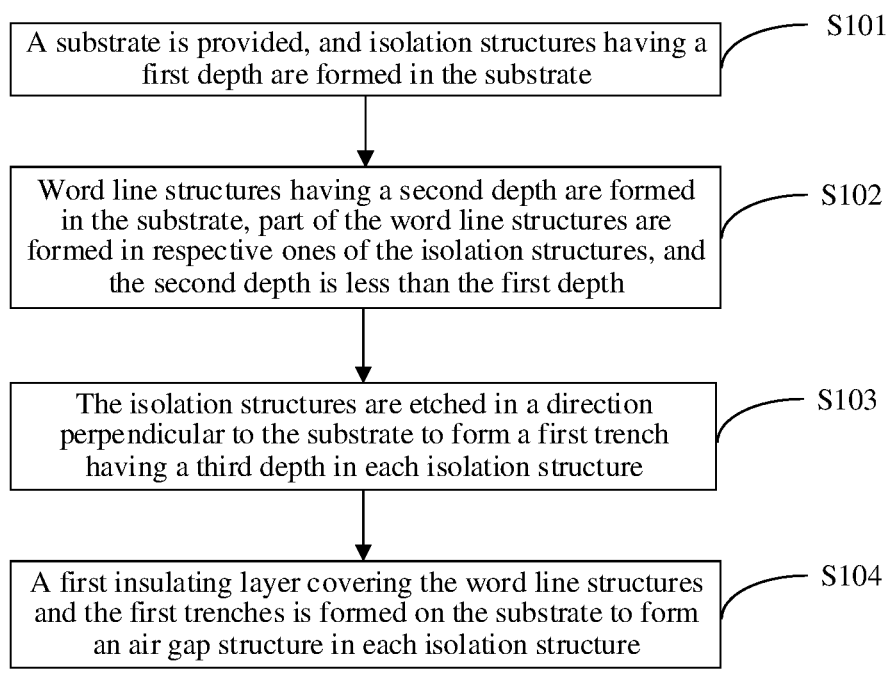
FIG. 2 is a schematic flowchart of a method for manufacturing a semiconductor structure provided in an embodiment of the disclosure.

In an embodiment of the disclosure, referring to FIG. 2, it illustrates a schematic flowchart of a method for manufacturing a semiconductor structure provided in an embodiment of the disclosure. As shown in FIG. 2, the method may include the following operations.

At S101, a substrate is provided, and isolation structures having a first depth are formed in the substrate.

Herein, the substrate may include a doped or undoped monocrystalline silicon substrate, a polycrystalline silicon substrate, etc. For example, the substrate may include an N-type polycrystalline silicon substrate or a P-type polycrystalline silicon substrate. In the embodiment of the disclosure, the polycrystalline silicon substrate is described as an example, but it is not specifically limited.

Figure 3A:
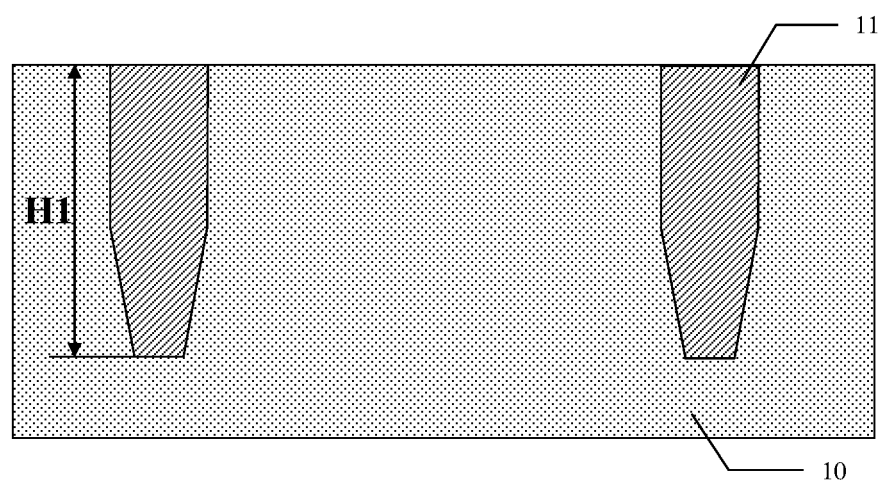
FIG. 3A is a schematic diagram of a section of a substrate with isolation structures provided in an embodiment of the disclosure.
Figure 3B:
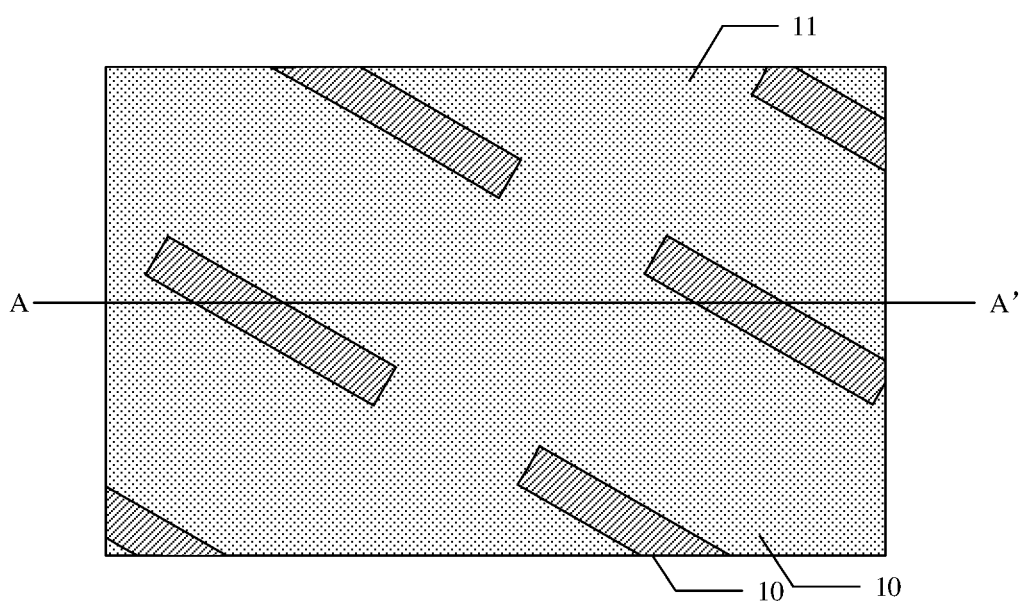
FIG. 3B is a top view of a substrate with isolation structures provided in an embodiment of the disclosure.

In the embodiment of the disclosure, referring to FIG. 3A and FIG. 3B, FIG. 3A illustrates a schematic diagram of a section of a substrate with isolation structures provided in an embodiment of the disclosure, and FIG. 3B illustrates a top view of a substrate with isolation structures provided in an embodiment of the disclosure, herein, FIG. 3A is a schematic diagram of a section in the AA' direction in FIG. 3B.

Herein, as shown in FIG. 3A, a substrate 10 is provided, the substrate 10 is etched to form trenches, and deposition and filling are performed on the trenches to form isolation structures 11. A depositing and filling material may include insulating material silicon nitride, etc. The isolation structures 11 have a first depth H1, and a plurality of active areas may be defined in the substrate 10 through the isolation structures 11.

Figure 3C:
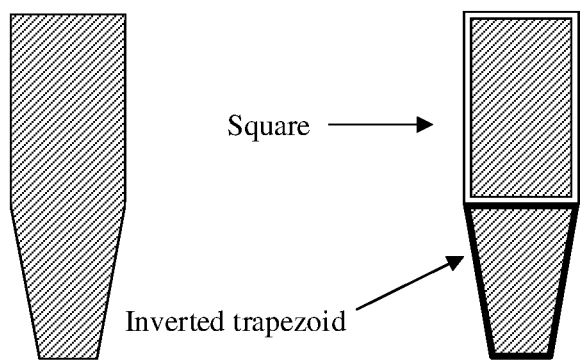
FIG. 3C is a schematic diagram of a section of isolation structures provided in an embodiment of the disclosure.

It should also be noted that, as shown in FIG. 3C, it illustrates a schematic diagram of a section of isolation structures provided in an embodiment of the disclosure. In an embodiment of the disclosure, a section of the isolation structure 11 may include an upper part and a lower part, the upper part is in a shape of a square, and the lower part is in a shape of an inverted trapezoid. The isolation structure 11 with such structural characteristics is taken as an example, the specific implementation of the embodiment of the disclosure is described. As shown in FIG. 3C, a white square frame depicts a square outline of the upper part of the section of the isolation structure 11, and a black trapezoidal frame depicts an inverted trapezoidal outline of the lower part of the section of the isolation structure 11. It can be understood that, the isolation structure 11 may also be in a form known to those skilled in the art. For example, the section shape of the isolation structure 11 may also be "U-shaped at the upper part and V-shaped at the lower part", or the section shape of the isolation structure 11 may also be "U-shaped or V-shaped as a whole", or the section shape of the isolation structure 11 may also be "inverted trapezoid or square as a whole", etc. The embodiments of the disclosure are not specifically limited to this.

At S102, word line structures having a second depth are formed in the substrate, where part of the word line structures are formed in respective ones of the isolation structures, and the second depth is less than the first depth.

It should be noted that, when the word line structures are formed in the substrate, part of the word line structures will also be formed in respective isolation structures. Herein, the word line structures have a second depth, and the second depth is less than the first depth.

It should also be noted that, in the embodiment of the disclosure, the word line structure is a Buried Wordline (BW) structure.

In some embodiments, for S102, the operation that the word line structures having the second depth are formed in the substrate may include the following operations.

Word line trenches having the second depth are formed in the substrate, and part of the word line trenches are formed in respective ones of the isolation structures.

A gate dielectric layer is formed on a side wall and at a bottom of each word line trench.

An adhesive layer is formed on the surface of the gate dielectric layer.

A word line metal is filled in the word line trench.

Figure 4A:
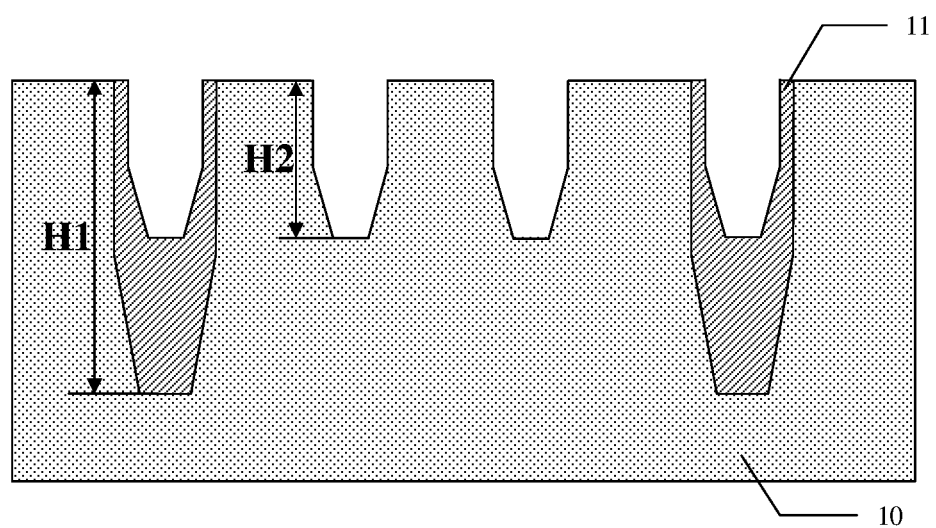
FIG. 4A is a schematic diagram of a section of a structure obtained after a word line trench is formed in a substrate provided in an embodiment of the disclosure.
Figure 4B:
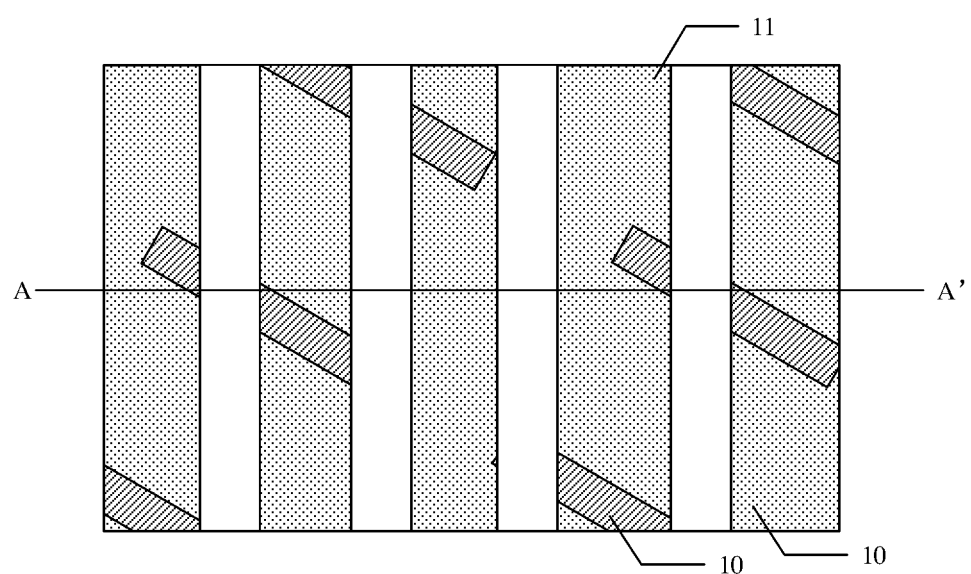
FIG. 4B is a top view of a structure obtained after a word line trench is formed in a substrate provided in an embodiment of the disclosure.

It should be noted that, referring to FIG. 4A and FIG. 4B, FIG. 4A illustrates a schematic diagram of a section of a structure obtained after a word line trench is formed in a substrate provided in an embodiment of the disclosure, and FIG. 4B illustrates a top view of a structure obtained after a word line trench is formed in a substrate provided in an embodiment of the disclosure, herein, FIG. 4A is a schematic diagram of a section in the AA' direction of in FIG. 4B.

As shown in FIG. 4A, the word line trenches having the second depth H2 are formed in the substrate 10, and part of the word line trenches are formed in respective ones of the isolation structures 11.

Specifically, several word line trenches may be formed by etching the substrate 10 and the isolation structures 11. Since the word line structure is formed in the word line trench, the depth of the word line trench is also the second depth H2, and the second depth H2 is less than the first depth H1 of the isolation structure 11.

Further, in some embodiments, the operation that the word line trenches having the second depth are formed in the substrate may include the following operations.

A mask layer and a patterned photoresist layer are sequentially formed on the substrate.

Patterns of the photoresist layer are transferred to the mask layer.

The substrate is etched with the mask layer as a mask to form the word line trenches having the second depth.

It should be noted that, when the word line trench is formed, the following modes may be specifically adopted: at first, the mask layer and the patterned photoresist layer are sequentially formed on the substrate 10, and then patterns of the photoresist layer is transferred to the mask layer through an etching process. The mask layer may be a single-layer or multi-layer mask layer. For example, the mask layer may include a laminated layer composed of one or more of a silicon dioxide layer, a polycrystalline silicon layer and a carbon layer, and the mask layer may further include a laminated layer composed of one or more of an antireflective layer and a silicon oxynitride layer.

After patterns of the photoresist layer are transferred to the mask layer, the substrate 10 is etched by using the mask layer as a mask to form a plurality of word line trenches. An etching gas may include chlorine, hydrogen bromide, difluoromethane, etc. It may also improve the time difference between ions and neutral particle staying on the substrate 10 through periodic radio-frequency output and improve the uniformity of the depth of the word line trench.

It can be seen from FIG. 4A and FIG. 4B that, the word line trenches are formed in the substrate 10 and part of the word line trenches are formed in respective ones of the isolation structures 11.

Figure 5:
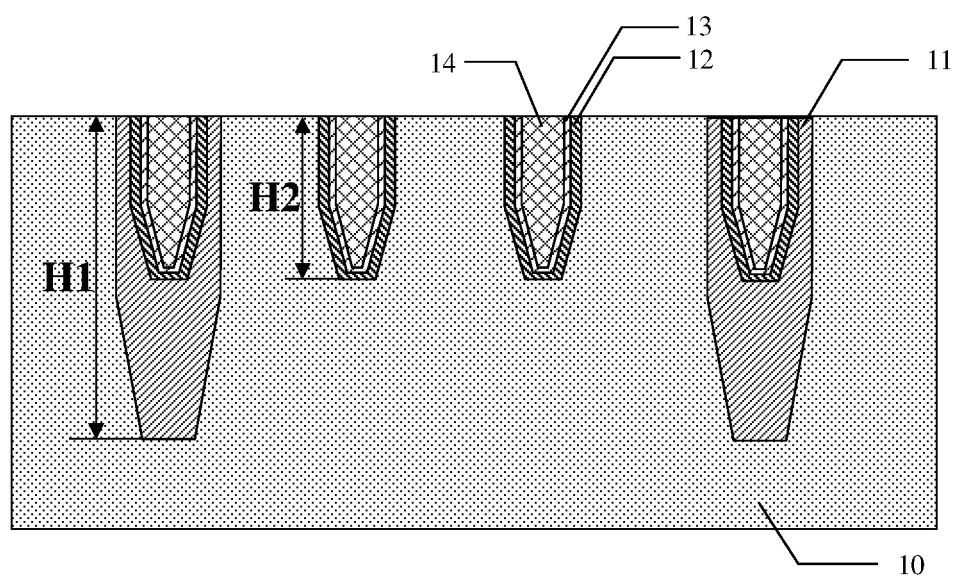
FIG. 5 is a schematic diagram of a section of a structure obtained after a word line structure is formed in a substrate provided in an embodiment of the disclosure.

After the word line trench is formed, referring to FIG. 5, it illustrates a schematic diagram of a section of a structure obtained after a word line structure is formed in a substrate provided in an embodiment of the disclosure. As shown in FIG. 5, a gate dielectric layer 12, an adhesive layer 13 and a word line metal 14 are sequentially formed in the word line trench to obtain a word line structure.

Specifically, at first, the gate dielectric layer 12 is formed on a side wall and at a bottom of each word line trench. The gate dielectric layer 12 is a high-K material such as silicon dioxide. The material of the gate dielectric layer 12 may also be silicon oxide, silicon nitride, etc., which may be formed by Atomic Layer Deposition (ALD), Chemical Vapor Deposition or Rapid Thermal Oxidation (RTO).

After the gate dielectric layer 12 is formed, the adhesive layer 13 may also be formed on the surface of the gate dielectric layer 12. The material of the adhesive layer 13 may include titanium nitride, and the adhesive layer 13 may improve the adhesion between the subsequently formed word line metal 14 and the gate dielectric layer 12.

After the adhesive layer 13 is formed, the word line metal 14 is filled in the word line trench, and the material of the word line metal 14 may include tungsten or the like. In some embodiments, the adhesive layer 13 may also not be formed, and the word line metal 14 may be directly filled in the word line trench after the gate dielectric layer 12 is formed.

That is, in the embodiment of the disclosure, each word line structure is formed in the word line trench and may include three parts, namely the gate dielectric layer 12, the adhesive layer 13 and the word line metal 14; or, the word line structure may also only include two parts, namely the gate dielectric layer 12 and the word line metal 14. In the embodiment of the disclosure, the word line structure including three parts, namely the gate dielectric layer 12, the adhesive layer 13 and the word line metal 14, is mainly taken as an example.

Further, after the word line structure is formed, in some embodiments, the method may further include the following operations.

The adhesive layer and the word line metal are etched, so that upper surfaces of the adhesive layer and the word line metal after being etched are lower than an upper surface of the substrate to form a word line top trench.

Figure 6:
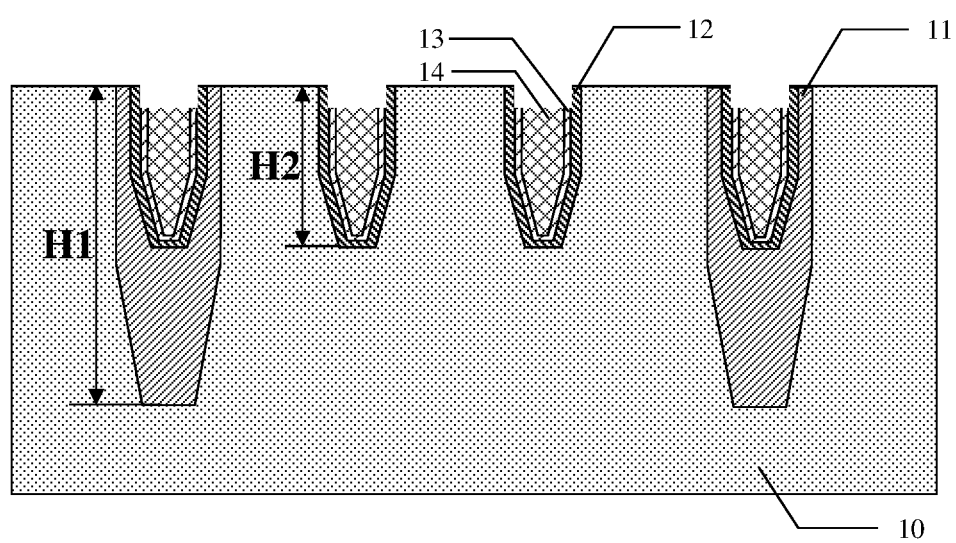
FIG. 6 is a schematic diagram of a section of a structure obtained after a word line top trench is formed in a word line structure provided in an embodiment of the disclosure.

It should be noted that, referring to FIG. 6, it illustrates a schematic diagram of a section of a structure obtained after a word line top trench is formed in a word line structure provided in an embodiment of the disclosure. As shown in FIG. 6, the adhesive layer 13 and the word line metal 14 are etched to form an opening above the word line structure, so that the upper surfaces of the adhesive layer 13 and the word line metal 14 after being etched are lower than the upper surface of the substrate 10. The opening is the word line top trench, the lower surface of the word line top trench is the surface where the adhesive layer 13 and the word line metal 14 after being etched are located, and the upper surface is the same plane as the upper surface of the substrate 10.

At S103, the isolation structures are etched in a direction perpendicular to the substrate to form a first trench having a third depth in each isolation structure.

It should be noted that, after the word line structure is formed, the isolation structure may be etched in a direction perpendicular to the substrate, so as to form a first trench having a third depth in each isolation structure.

For S103, in some embodiments, before the isolation structures are etched in the direction perpendicular to the substrate to form the first trench having the third depth in each isolation structure, the method may further include: a protective layer is formed on the substrate to protect the substrate when the isolation structure is etched.

Figure 7:
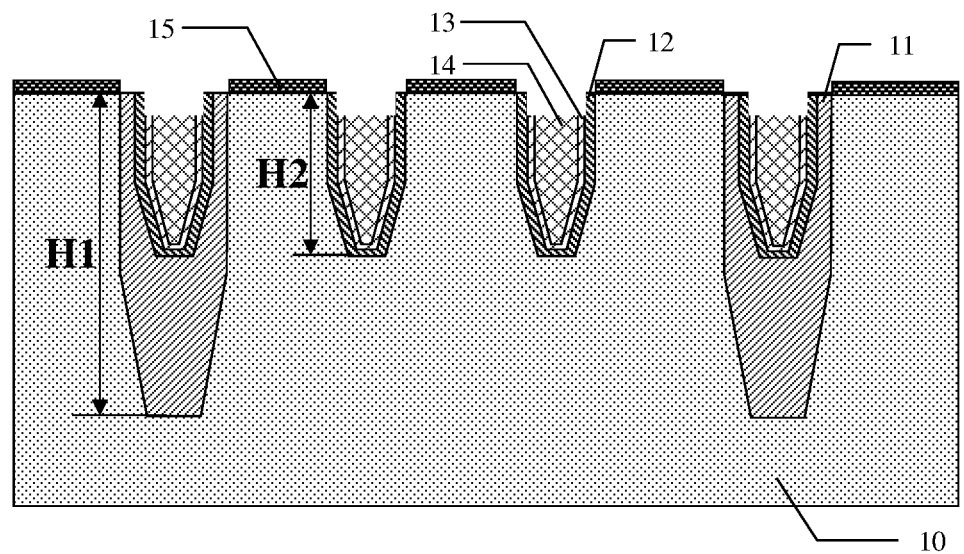
FIG. 7 is a schematic diagram of a section of a structure obtained after a protective layer is formed above a substrate provided in an embodiment of the disclosure.

It should be noted that, before the isolation structure is etched, in an embodiment of the disclosure, a protective layer may also be formed on the substrate to protect the substrate when the isolation structure is etched. Referring to FIG. 7, it illustrates a schematic diagram of a section of a structure obtained after a protective layer is formed above a substrate provided in an embodiment of the disclosure. As shown in FIG. 7, the protective layer 15 is formed on the substrate 10. A process of forming the protective layer 15 may include in-situ growth, etc., and the material of the protective layer 15 may include silicon dioxide. The function of the protective layer 15 is to protect the substrate 10 from being etched when the isolation structure 11 is subsequently etched.

Figure 8:
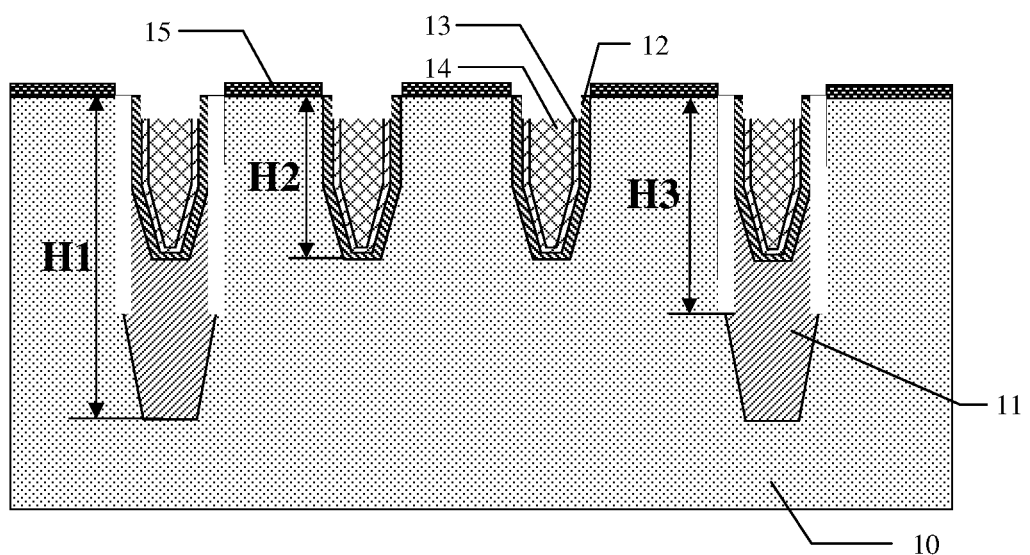
FIG. 8 is a schematic diagram of a section of a structure obtained after a first trench having a third depth is formed provided in an embodiment of the disclosure.

After the protective layer 15 is formed, the isolation structures 11 are etched in a direction perpendicular to the substrate 10 to form a first trench having a third depth H3 in each isolation structure 11. Referring to FIG. 8, it illustrates a schematic diagram of a section of a structure obtained after a first trench having a third depth is formed provided in an embodiment of the disclosure.

When the isolation structures are etched to form the first trench having the third depth, in some embodiments, the operation that the isolation structures are etched in a direction perpendicular to the substrate to form the first trench having the third depth in each isolation structure may include the following operations.

Based on the etching selection ratio between different materials, each isolation structure is etched in a direction perpendicular to the substrate to form the first trench having the third depth.

It should be noted that, since part of the word line structures are formed in respective ones of the isolation structures 11, that is, part of the gate dielectric layers 12 of the word line structures are appressed against respective isolation structures 11, in order to avoid damage to the gate dielectric layer 12 when the isolation structure 11 is etched and to avoid damage to the substrate 10, the isolation structure 11 may be etched based on the etching selection ratio between different materials, and the isolation structure 11 in the vertical direction is removed along the direction perpendicular to the substrate 10 shown in FIG. 8. Since the material of the gate dielectric layer 12 may include silicon dioxide and the material of the isolation structure 11 may include silicon nitride, silicon nitride in the vertical direction may be removed based on the etching selection ratio of silicon dioxide and silicon nitride to obtain the first trench.

Moreover, in the embodiment of the disclosure, a section of the isolation structure 11 may include an upper part and a lower part, the upper part is in a shape of a square, and the lower part is in a shape of an inverted trapezoid. Based on the isolation structure 11 with such structural characteristics, the method may further include the following operations.

Based on the first trench having the third depth, the substrate is further etched in the direction perpendicular to the substrate to form a first trench having a fourth depth, and the fourth depth is greater than the first depth.

Figure 9:
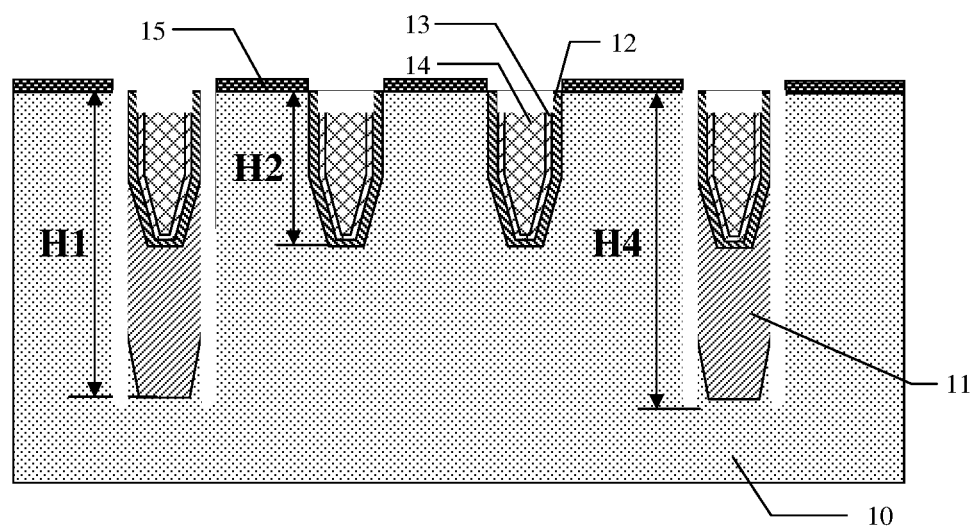
FIG. 9 is a schematic diagram of a section of a structure obtained after a first trench having a fourth depth is formed provided in an embodiment of the disclosure.

It should be noted that, based on the "upper square and lower inverted trapezoid" shape of the section of the isolation structure 11, the substrate 10 is further etched in the direction perpendicular to the substrate 10, so that the depth of the first trench is further deepened to the fourth depth H4, and the fourth depth is greater than the first depth of the isolation structure 11. Referring to FIG. 9, it illustrates a schematic diagram of a section of a structure obtained after a first trench having a fourth depth is formed provided in an embodiment of the disclosure.

As shown in FIG. 9, when the section of the isolation structure 11 has the shape of "upper square and lower inverted trapezoid", the first trench may not only include a part formed by etching the isolation structure 11, but further include a part formed by further etching the substrate 10 downward. That is, in this case, the first trench may be divided into a first part and a second part. The first part is obtained by etching the isolation structure 11 in the direction perpendicular to the substrate 10, and the second part is obtained by etching the substrate 10 in the direction perpendicular to the substrate 10 based on the first part. The two parts together form the first trench in this case.

It should also be noted that, when the substrate 10 is further etched downward based on the first part, an anisotropic etching method may be adopted to make the etching direction downward, and mainly etch the substrate 10 below the first part, so as to reduce the damage to the side surface of the substrate 10.

At S104, a first insulating layer covering the word line structures and the first trenches is formed on the substrate to form an air gap structure in each isolation structure.

It should be noted that, after the first trench is formed, the first insulating layer covering the word line structures and the first trenches is formed on the substrate, so as to close the first trench and form the air gap structure.

For S104, in some embodiments, before the first insulating layer covering the word line structures and the first trenches is formed on the substrate, the method may further include: a second insulating layer is formed on a surface of the substrate exposed by the first trench.

Figure 10:
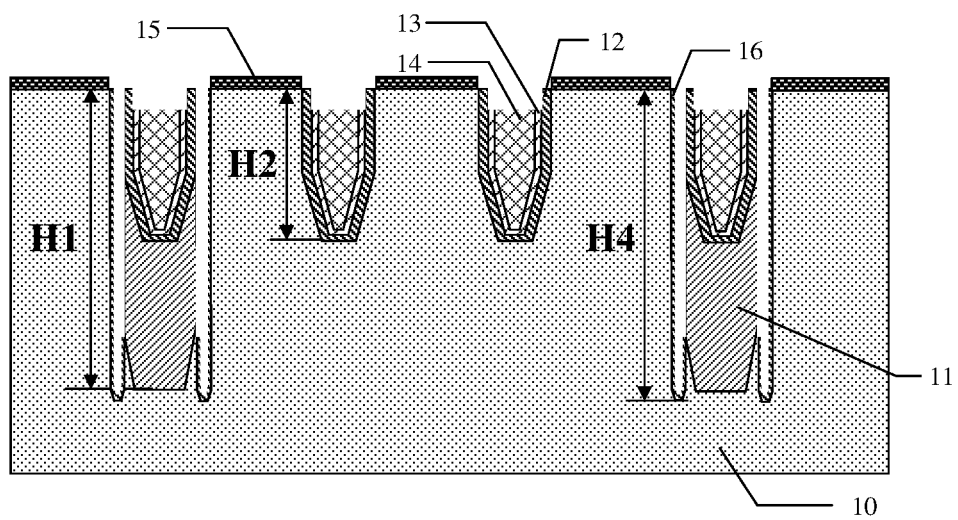
FIG. 10 is a schematic diagram of a section of a structure obtained after a second insulating layer is formed provided in an embodiment of the disclosure.

It should be noted that, in the embodiment of the disclosure, after the first trench is formed, the first trench is formed between the substrate 10 and the isolation structure 11, and the first trench exposes part of the substrate 10. In order to further improve the insulation performance, a second insulating layer 16 is also formed on the surface of part of the substrate 10 exposed by the first trench. Referring to FIG. 10, it illustrates a schematic diagram of a section of a structure obtained after a second insulating layer is formed provided in an embodiment of the disclosure.

Further, in some embodiments, for the second insulating layer, the operation that the second insulating layer is formed on the surface of the substrate exposed by the first trench may include: the surface of the substrate is oxidized exposed by the first trench to form the second insulating layer.

It should be noted that, the second insulating layer 16 may be formed by directly oxidizing the exposed part of the substrate 10. Specifically, the substrate 10 may be oxidized by In-Situ Steam Generation (ISSG) to form the second insulating layer 16.

After the second insulating layer 16 is formed to further improve the insulation performance, the word line structure and the first trench may be covered to form the first insulating layer. Before that, the protective layer 15 needs to be removed. Therefore, in some embodiments, after the second insulating layer is formed on the surface of the substrate exposed by the first trench, the method may further include: the protective layer is removed.

Figure 11:
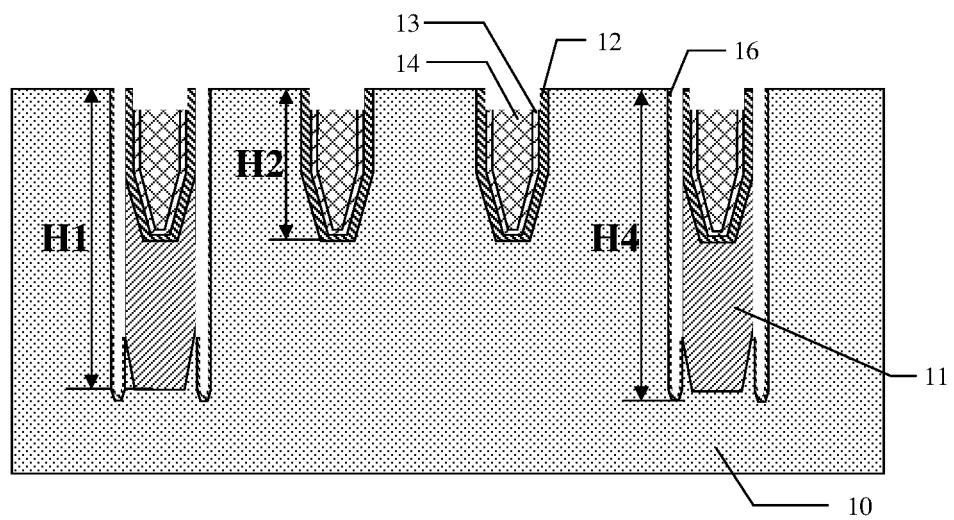
FIG. 11 is a schematic diagram of a section of a structure obtained after a protective layer is removed provided in an embodiment of the disclosure.

It should be noted that, after the second insulating layer 16 is formed, the protective layer 15 is removed. Referring to FIG. 11, it illustrates a schematic diagram of a section of a structure obtained after the protective layer is removed provided in an embodiment of the disclosure.

For formation of the first insulating layer, in some embodiments, the operation that the first insulating layer covering the word line structures and the first trenches is formed on the substrate may include the following operations.

Silicon nitride is deposited over the word line top trench, the substrate and the first trench to form the first insulating layer.

Figure 12:
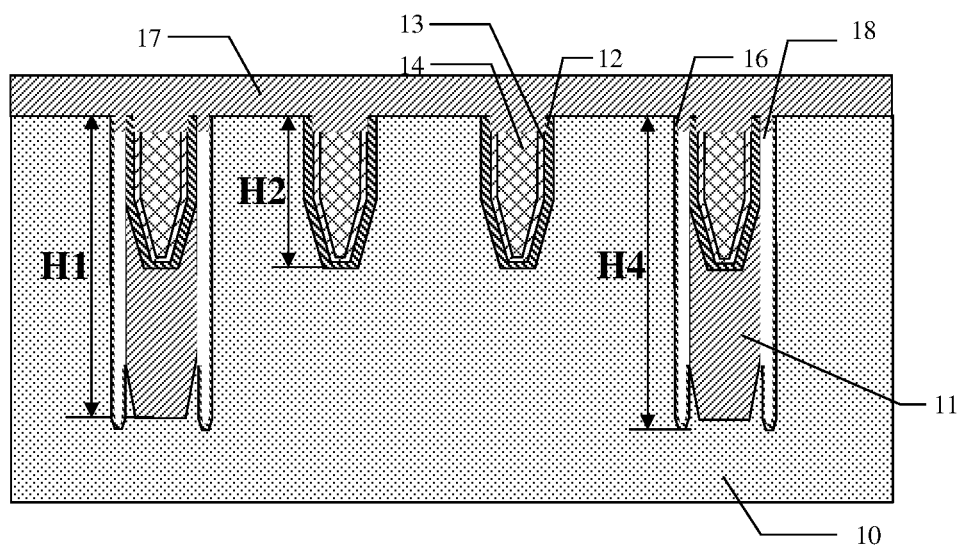
FIG. 12 is a schematic diagram of a section of a semiconductor structure provided in an embodiment of the disclosure.

It should be noted that, an insulating material such as silicon nitride is deposited above the word line top trench, the substrate 10 and the first trench to form the first insulating layer 17, so as to obtain a semiconductor structure. Referring to FIG. 12, it illustrates a schematic diagram of a section of a semiconductor structure provided in an embodiment of the disclosure.

Moreover, in order to prevent a deposition material from entering the first trench to fill the first trench during the deposition process, a method of rapid sealing may be adopted in this step, so that the deposition material only enters the position with less depth above the first trench. Therefore, after the top of the first trench is covered, an air gap structure 18 is formed. The air gap structure 18 may effectively improve the insulation performance of the semiconductor structure, and the insulation performance may be further enhanced due to the existence of the second insulating layer 16.

In short, the method for manufacturing the semiconductor structure provided in the embodiments of the disclosure relates to a semiconductor memory technology, in particular to the structure and the flow of a memory component device, which uses a transistor to control digital signal storage and is applied to the DRAM. The flow of the method is briefly described as follows: firstly, a word line trench with a BW structure is formed in a substrate with STI, and silicon dioxide (a gate dielectric layer), titanium nitride (an adhesive layer) and tungsten (a word line metal) are sequentially formed in the word line trench; then, the excess titanium nitride and tungsten are removed by etching to form a word line top trench; then, a layer of silicon dioxide (a protective layer) is formed on the surface of the substrate by in-situ growth; then, silicon nitride (STI) in the vertical direction is removed by the etching selection ratio of silicon dioxide and silicon nitride; then, the polycrystalline silicon (a substrate) is further etched downward to form a first trench, and the height of the first trench is greater than that of the STI; then, the polycrystalline silicon in the first trench is oxidized by ISSG to form a second insulating layer to further improve the insulation performance; and finally, the silicon dioxide at the top is removed and the top is covered with silicon nitride (a first insulating layer).

Figure 13A:
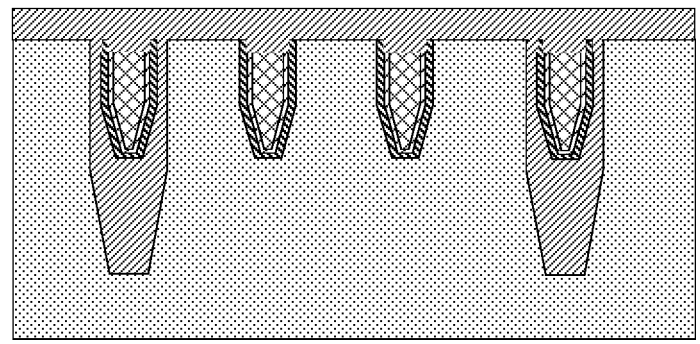
FIG. 13A is a schematic diagram of a semiconductor structure without an air gap structure provided in an embodiment of the disclosure.
Figure 13B:
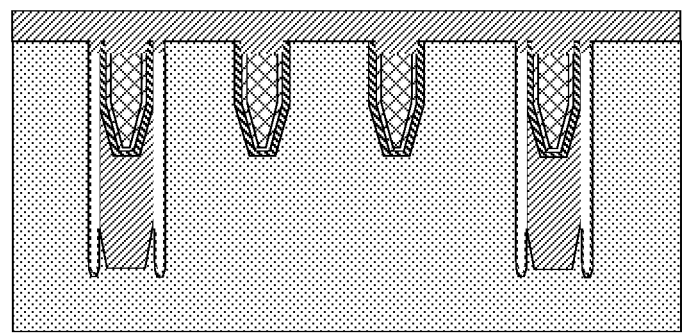
FIG. 13B is a schematic diagram of a semiconductor structure with an air gap structure for section comparison to a semiconductor structure without an air gap structure as illustrated in FIG. 13A in an embodiment of the disclosure.

Referring to FIG. 13A and FIG. 13B, it illustrates a schematic diagram for section comparison of a semiconductor structure with an air gap structure and a semiconductor structure without an air gap structure provided in an embodiment of the disclosure. FIG. 13A is a schematic diagram of a semiconductor structure without an air gap structure, and FIG. 13B is a schematic diagram of a semiconductor structure with an air gap structure. By forming the air gap structure in STI, the insulation performance may be significantly improved, the capacitive coupling effect between word lines may be reduced, and the influence caused by tip leakage may be reduced.

According to a method for manufacturing a semiconductor structure provided in the embodiments, a substrate is provided; isolation structures having a first depth are formed in the substrate; word line structures having a second depth are formed in the substrate, where part of the word line structures are formed in respective ones of the isolation structures, and the second depth is less than the first depth; the isolation structures are etched in a direction perpendicular to the substrate to form a first trench having a third depth in each isolation structure; and a first insulating layer covering the word line structures and the first trenches is formed on the substrate to form an air gap structure in each isolation structure. In this way, by forming the air gap structure in each isolation structure, the insulation performance is improved, which not only reduces the capacitive coupling effect, but also reduces the influence caused by tip leakage.

In another embodiment of the disclosure, referring to FIG. 12 above, it illustrates a schematic diagram of a section of a semiconductor structure provided in an embodiment of the disclosure. As shown in FIG. 12, the semiconductor structure may include a substrate 10, isolation structures 11, word line structures, first trenches and a first insulating layer 17.

The isolation structures 11 are formed in the substrate 10 and have a first depth.

The word line structures are formed in the substrate 10 and have a second depth, where part of the word line structures are formed in respective ones of the isolation structures 11, and the second depth is less than the first depth.

The first trenches are formed in respective isolation structures 11 in a direction perpendicular to the substrate 10 and have a third depth.

The first insulating layer 17 is formed on the substrate 10 and covers the word line structures and the first trenches to form an air gap structure 18 in each isolation structure 11.

In some embodiments, a section of the isolation structure 11 may include an upper part and a lower part. The upper part is in a shape of a square, and the lower part is in a shape of an inverted trapezoid.

In some embodiments, the first trenches are formed in respective isolation structures 11 and the substrate 10 in a direction perpendicular to the substrate 10 and have a fourth depth, and the fourth depth is greater than the first depth.

In some embodiments, the semiconductor structure may further include a second insulating layer 16.

The second insulating layer 16 is formed on the surface of the substrate 10 exposed by the first trench.

In some embodiments, the word line structure may include a word line trench, a gate dielectric layer 12, an adhesive layer 13 and a word line metal 14.

The word line trenches are formed in the substrate 10 and have a second depth, and part of the word line trenches are formed in respective ones of the isolation structures 11.

The gate dielectric layer 12 is formed on a side wall and at a bottom of each word line trench.

The adhesive layer 13 is formed on the surface of the gate dielectric layer 12.

The word line metal 14 is filled in the word line trench.

In some embodiments, the upper surfaces of the adhesive layer 13 and the word line metal 14 are lower than the upper surface of the substrate 10.

In some embodiments, the word line structure is a BW structure.

The embodiments of the disclosure provide a semiconductor structure, which may include a substrate, isolation structures, word line structures, first trenches and a first insulating layer. The isolation structures are formed in the substrate and have a first depth; the word line structures are formed in the substrate and have a second depth, where part of the word line structures are formed in respective ones of the isolation structures, and the second depth is less than the first depth; the first trenches are formed in respective isolation structures in a direction perpendicular to the substrate and have a third depth; and the first insulating layer is formed on the substrate and covers the word line structures and the first trenches to form an air gap structure in each isolation structure. In this way, by forming the air gap structure in each isolation structure of the semiconductor structure, the insulation performance is improved, which not only reduces the capacitive coupling effect, but also reduces the influence caused by tip leakage. Moreover, since the second insulating layer is also formed on the surface of the substrate in the air gap structure, the insulation performance is further improved.

Figure 14:
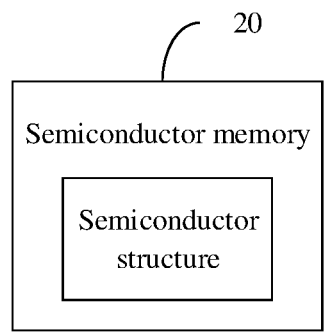
FIG. 14 is a schematic diagram of a composition structure of a semiconductor memory provided by an embodiment of the disclosure.

In yet another embodiment of the disclosure, referring to FIG. 14, it illustrates a schematic diagram of a composition structure of a semiconductor memory provided in an embodiment of the disclosure. As shown in FIG. 14, the semiconductor memory 20 may include the semiconductor structure described by any embodiment above.

In some embodiments, the semiconductor memory 20 may be a DRAM.

For the semiconductor memory 20, since it may include the semiconductor structure in the foregoing embodiment, the semiconductor structure may reduce the capacitive coupling effect and reduce the influence of tip leakage when the characteristic size of the semiconductor is reduced, so as to improve the storage capacity of the semiconductor memory.

The above is only a preferred embodiment of the disclosure and is not used to limit the scope of protection of the disclosure.

It is to be noted that, in the disclosure, the terms "include", "containing" or any other variation thereof are intended to cover non-exclusive inclusion, so that a process, method, article or device that includes a series of elements includes not only those elements, but also other elements not explicitly listed, or elements inherent in such process, method, article or device. Without further restrictions, the element defined by the statement "including a . . . " does not exclude the existence of another same element in the process, method, article or device including the element.

The above serial numbers of the embodiments of the disclosure are only for description and does not represent that one embodiment with a small serial number is superior to another embodiment with a large serial number.

The methods disclosed in several method embodiments provided by the disclosure may be combined arbitrarily without conflict to obtain new method embodiments.

The features disclosed in several product embodiments provided by the disclosure may be combined arbitrarily without conflict to obtain new product embodiments.

The features disclosed in several methods or device embodiments provided by the disclosure may be combined arbitrarily without conflict to obtain new method embodiments or device embodiments.

The above are only specific implementation mode of the disclosure and not intended to limit the scope of protection of the disclosure. Modifications or replacements are apparent to those skilled in the art within the technical scope disclosed by the embodiment of the disclosure, and these modifications or replacements shall fall within the scope of protection of the disclosure. Therefore, the scope of protection of the disclosure should be subject to the scope of protection of the claims.

INDUSTRIAL APPLICABILITY

In the embodiment of the disclosure: a substrate is provided; isolation structures having a first depth are formed in the substrate; word line structures having a second depth are formed in the substrate, where part of the word line structures are formed in respective ones of the isolation structures, and the second depth is less than the first depth; the isolation structures are etched in a direction perpendicular to the substrate to form a first trench having a third depth in each isolation structure; and a first insulating layer covering the word line structures and the first trenches is formed on the substrate to form an air gap structure in each isolation structure. In this way, by forming the air gap structure in each isolation structure, the insulation performance of the semiconductor structure is effectively improved, which not only reduces the capacitive coupling effect between word lines, but also reduces the influence caused by tip leakage.

The invention claimed is:

1. A method for manufacturing a semiconductor structure, comprising:
providing a substrate, and forming isolation structures having a first depth in the substrate;
forming word line structures having a second depth in the substrate, wherein part of the word line structures are formed in respective ones of the isolation structures, and the second depth is less than the first depth;
etching the isolation structures in a direction perpendicular to the substrate to form a first trench having a third depth in each isolation structure;
forming a second insulating layer on a surface of the substrate exposed by the first trench; and
forming a first insulating layer covering the word line structures and the first trenches on the substrate to form an air gap structure in each isolation structure.

2. The method of claim 1, wherein a section of the isolation structure comprises an upper part and a lower part, the upper part is in a shape of a square, and the lower part is in a shape of an inverted trapezoid; and the method further comprises:
further etching the substrate in the direction perpendicular to the substrate based on the first trench having the third depth to form a first trench having a fourth depth, wherein the fourth depth is greater than the first depth.

3. The method of claim 1, wherein
forming the second insulating layer on the surface of the substrate exposed by the first trench comprises:
oxidizing the surface of the substrate exposed by the first trench to form the second insulating layer.

4. The method of claim 1, wherein
forming the word line structures having the second depth in the substrate comprises:
forming word line trenches having the second depth in the substrate, part of the word line trenches being formed in respective ones of the isolation structures;
forming a gate dielectric layer on a side wall and at a bottom of each word line trench;
forming an adhesive layer on a surface of the gate dielectric layer; and
filling a word line metal in the word line trench.

5. The method of claim 4, wherein
forming the word line trenches having the second depth in the substrate comprises:
sequentially forming a mask layer and a patterned photoresist layer on the substrate;
transferring patterns of the photoresist layer to the mask layer; and
etching the substrate with the mask layer as a mask to form the word line trenches having the second depth.

6. The method of claim 4, further comprising:
etching the adhesive layer and the word line metal, so that upper surfaces of the adhesive layer and the word line metal after being etched are lower than an upper surface of the substrate to form a word line top trench.

7. The method of claim 6, wherein
forming the first insulating layer covering the word line structures and the first trenches on the substrate comprises:
depositing silicon nitride over each word line top trench, the substrate and each first trench to form the first insulating layer.

8. The method of claim 1, further comprising:
before etching the isolation structures in the direction perpendicular to the substrate to form the first trench having the third depth in each isolation structure, forming a protective layer on the substrate, to protect the substrate when the isolation structure is etched.

9. The method of claim 8, wherein
etching the isolation structures in the direction perpendicular to the substrate to form the first trench having the third depth in each isolation structure comprises:
etching each isolation structure in the direction perpendicular to the substrate based on an etching selection ratio between different materials, to form the first trench having the third depth.

10. The method of claim 9, further comprising:
after forming the second insulating layer on the surface of the substrate exposed by the first trench,
removing the protective layer.

11. The method of claim 1, wherein
the word line structure is a Buried Wordline (BW) structure.

12. A semiconductor structure, comprising:
a substrate;
isolation structures, formed in the substrate and having a first depth;
word line structures, formed in the substrate and having a second depth, wherein part of the word line structures are formed in respective ones of the isolation structures, and the second depth is less than the first depth;
first trenches, formed in respective isolation structures in a direction perpendicular to the substrate and having a third depth;
a first insulating layer, formed on the substrate and covering the word line structures and the first trenches to form an air gap structure in each isolation structure; and
a second insulating layer, formed on a surface of the substrate exposed by the first trench.

13. The semiconductor structure of claim 12, wherein
a section of the isolation structure comprises an upper part and a lower part, the upper part is in a shape of a square, and the lower part is in a shape of an inverted trapezoid.

14. The semiconductor structure of claim 13, wherein
the first trenches are formed in respective isolation structures and the substrate in a direction perpendicular to the substrate and have a fourth depth, and the fourth depth is greater than the first depth.

15. The semiconductor structure of claim 12, wherein
each word line structure comprises:
a word line trench, formed in the substrate and having a second depth, wherein part of the word line trenches are formed in respective ones of the isolation structures;
a gate dielectric layer, formed on a side wall and at a bottom of the word line trench;
an adhesive layer, formed on a surface of the gate dielectric layer; and
a word line metal filled in the word line trench.

16. The semiconductor structure of claim 15, wherein
upper surfaces of the adhesive layer and the word line metal are lower than an upper surface of the substrate.

17. The semiconductor structure of claim 12, wherein
the word line structure is a Buried Wordline (BW) structure.

18. A semiconductor memory, comprising
the semiconductor structure according to claim 12.

* * * * *